Figure 1:
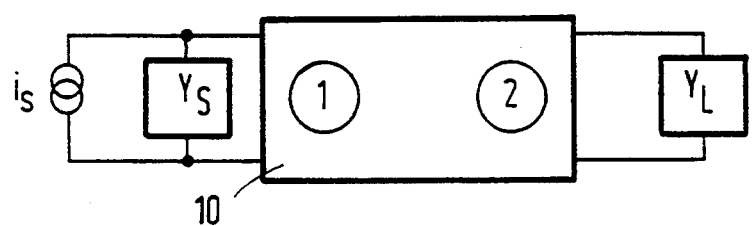

United States Patent [19]

Milsom

[11] Patent Number: 5,394,346

[45] Date of Patent: Feb. 28, 1995

[54] SIMULATION OF AN ELECTRONIC SYSTEM INCLUDING ANALOG AND DIGITAL CIRCUITRY USING HIGH LEVEL MACRO MODELS

[75] Inventor: Robert F. Milsom, Redhill, England

[73] Assignee: U.S. Philips Corporation, New York, N.Y.

[21] Appl. No.: 18,998

[22] Filed: Feb. 18, 1993

[30] Foreign Application Priority Data

Feb. 19, 1992 [GB] United Kingdom ............... 9203507

[51] Int. Cl.$^6$ .................. G06G 7/48; G06F 15/20
[52] U.S. Cl. ............................ 364/578; 364/489; 364/602; 364/801
[58] Field of Search ............ 364/578, 188, 602, 607, 364/801, 488, 489, 490, 491; 395/500; 434/433

[56] References Cited

PUBLICATIONS

J. A. Connelly & P. Choi, Macromodeling wiht SPICE, Prentice Hall, 1992, pp. 6–7, 66–68, 159–165.

Primary Examiner—Ellis B. Ramirez
Assistant Examiner—Eric W. Stamber
Attorney, Agent, or Firm—Laurie E. Gathman

[57] ABSTRACT

A method of, and apparatus for, simulating an electronic system which comprises a sequence of interconnected functional blocks. The method comprises providing a high level macro model of each of the functional blocks, providing a low level description of each of the functional blocks in terms of a detailed circuit and/or physical layout and extracting parameters of each high level macro model from the low level description of the corresponding block by processing operations prior to simulation. The simulation comprises applying inputs signals to the system, computing the behavior of each functional block in the sequence, including the interaction with its neighbors, using the extracted parameters of the high level macro models, and monitoring the signals at the output of the system to determine if the system behaves as anticipated.

15 Claims, 3 Drawing Sheets

SIMULATION OF AN ELECTRONIC SYSTEM INCLUDING ANALOG AND DIGITAL CIRCUITRY USING HIGH LEVEL MACRO MODELS

DESCRIPTION

The present invention relates to the simulation of an electronic system, particularly, but not exclusively, to a system comprising mixed mode circuits, that is, circuits which comprise a mix of analog and digital circuitry.

Simulating the performance of an electronic system accurately and quickly leads to a reduced development time scale and an improved design quality. Circuit simulation is not new and has evolved over a number of years. An article "A systems approach to analogue simulation using Saber" by Andrew Patterson, Electronic Engineering, June 1987 pages 93,96,98 and 101 mentions that analogue circuit simulation has been treated as something of a black art and remarks that it is becoming more and more important to develop analogue simulators which can match and be integrated with existing simulators for digital designers. Digital simulation is moderately straightforward and can be regarded as solving sets of Boolean equations with respect to the propagation of binary values "1" and "0" in the time domain. With respect to analog simulators many simultaneous equations have to be solved for every time step and the simulator run-time increases geometrically with circuit complexity. This means that there is a practical circuit size limit of about 200 elements if the results are needed back in a reasonable time. It is impractical from the point of view of affordable computer power to model a complete system in this way. Although a system can be simulated in separate parts, such an approach fails to account fully for their interaction.

An alternative to simulating the individual components of an analog circuit is what is termed system level simulation. This type of simulation is reasonably satisfactory with system level digital models but system level analog models are typically only first order functional models which do not have the accuracy normally required for analog simulation.

An object of the present invention is to model a class of analog circuit with an accuracy comparable to detailed circuit analysis but with an efficiency comparable to that achievable using functional models of the constituent functional blocks.

According to a first aspect of the present invention there is provided a method of simulating an electronic system which comprises interconnected functional blocks, the method includes the steps of providing a high level macro model of each of the functional blocks, providing a low level description of each of the functional blocks in terms of a detailed circuit and/or physical layout, extracting parameters of each high level macro model from the low level description of the corresponding block by processing operations prior to simulation. The simulation including the steps of applying input signals to the system, computing the behavior of each functional block, including the interaction with its neighbors, using the extracted parameters of the high level macro models, and monitoring the signals at the inputs and outputs of the blocks to determine if the system behaves as anticipated.

The method in accordance with the present invention enables the performance of a system to be simulated with the speed of a high level model but with the accuracy of a model based directly on the low level description. The high level macro model obtains its accuracy through a pre-processing operation of extracting the essential system level linear and non-linear parameters from the low level or detailed circuit and/or layout descriptions. It obtains its efficiency through a simple set of relationships between inputs and outputs where the parameters in these relationships are those extracted. In the present specification the term "accuracy" means the chance of getting the circuit design right the first time and the term "efficiency" means making the simulation of complex products feasible.

In an embodiment of the present invention, the linear and non-linear parameters are stored in tabular form and are used alternately in the frequency and time domains to simulate the response of the given functional block to an electrical waveform taking into account the effect of loading by neighboring blocks.

In the macro models for linear blocks a combination of speed and accuracy is achieved by using a frequency domain and Fast Fourier Transform approach requiring only simple algebraic operations, whereas conventional time domain circuit simulation involves the much less efficient solution of partial differential equations. The macro models for non-linear blocks extend this approach by inverse transformation back to the time domain within the models, but only for those parts of the computation which require the current/voltage characteristic.

The parameters of the macro models are tables of admittance against frequency and current against voltage, which are extracted from the circuit descriptions by a pre-processing operation of running AC and DC analyses, respectively.

According to a second aspect of the present invention there is provided a method of simulating propagation of a signal through an electronic system, the method comprising the steps of:
—representing the system as a collection of functionally collaborating blocks;
—for each particular one of the blocks calculating physical quantities at a high system level, the calculation being based on information at a low system level of the particular one of the blocks;
—calculating the propagation of the signal among the blocks on the basis of said physical quantities at the high system level; and
—monitoring a result of the calculation of the propagation to check a behavior of the electronic system.

According to a third aspect of the present invention there is provided an apparatus for simulating an electronic system comprising means programmed for executing a method comprising providing a high level macro model of each of the functional blocks, providing a low level description of each of the functional blocks in terms of a detailed circuit and/or physical layout, extracting parameters of each high level macro model from the low level description of the corresponding block by processing operations prior to simulation, the simulation comprising applying input signals to the system, computing the behavior of each functional block, including the interaction with its neighbors, using the extracted parameters of the high level macro models, and monitoring the signals at the output of the system to determine if the system behaves as anticipated, in collaboration with a data processing system provided with data input means for enabling a user to control the execution of the method.

Typical applications for the macro models are amplifiers, filters, mixers and phase shifters, that is, circuits for which non-linearity is either small or at least monotonic. One practical application which can make use of the method in accordance with the present invention is the analog front end of a mixed system. In doing this the macro models of the stages for the analog front end can be integrated into a digital simulator, thus allowing the simulation of a complete product with a single simulator. The parameter extraction can be readily automated, and only has to be repeated for a given functional block for a change to the design of that block. The previously extracted model parameters for other blocks remain valid.

Compared to exclusively frequency domain models which are very efficient for modelling storage effects, that is circuits with capacitors and inductors, the method in accordance with the present invention allows the non-linear effects of some circuits to be included without discarding the advantages of the frequency domain.

The present invention may comprise a module provided with a computer program carrier and adapted for use with a general purpose computer to render the computer susceptible to user-interaction for simulating electronic circuitry.

Figure 2:
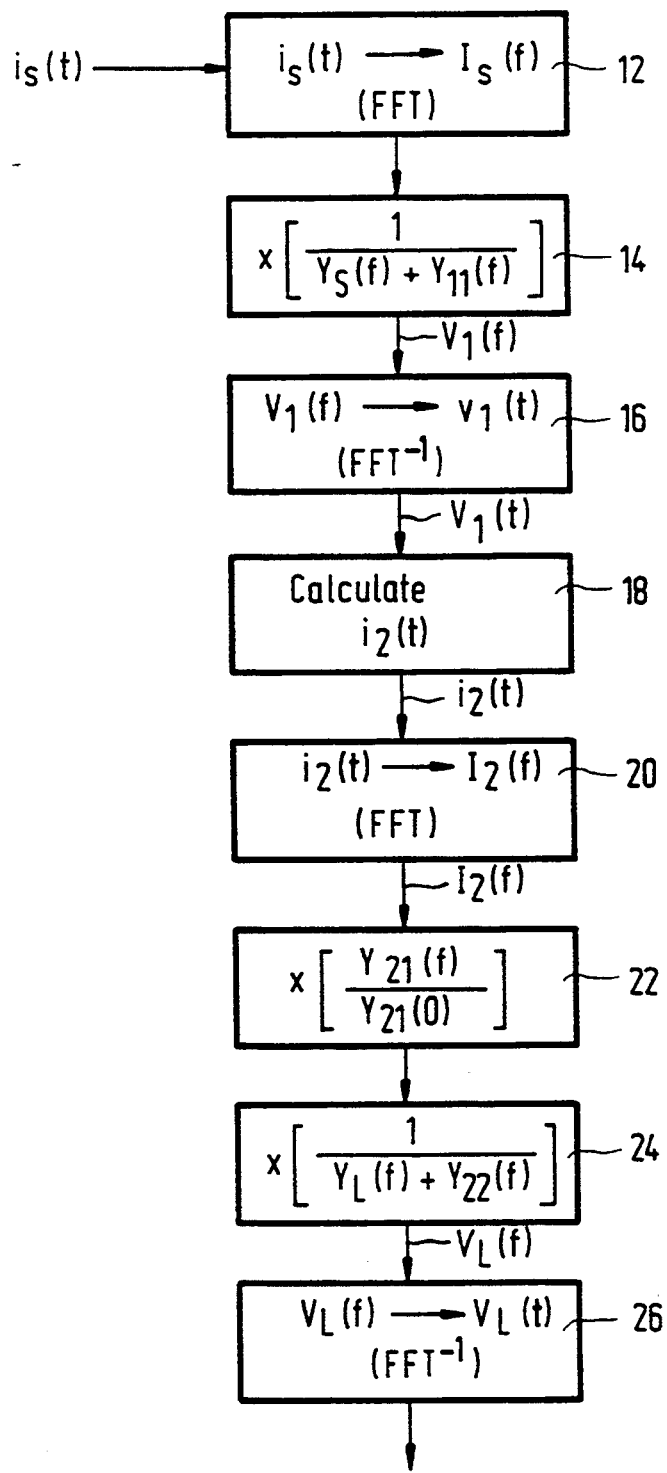
Figure 3:
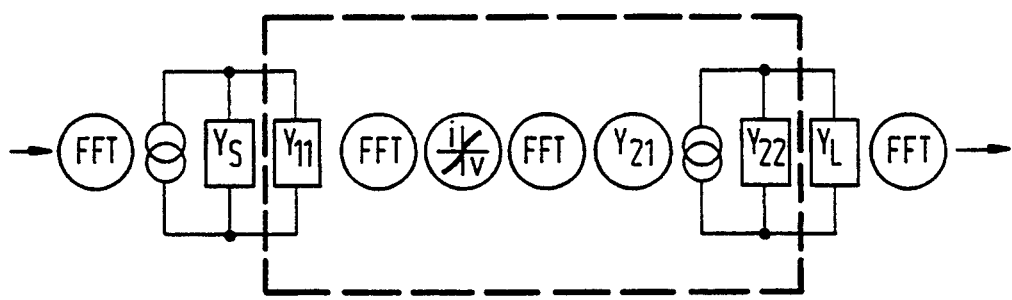
Figure 4:
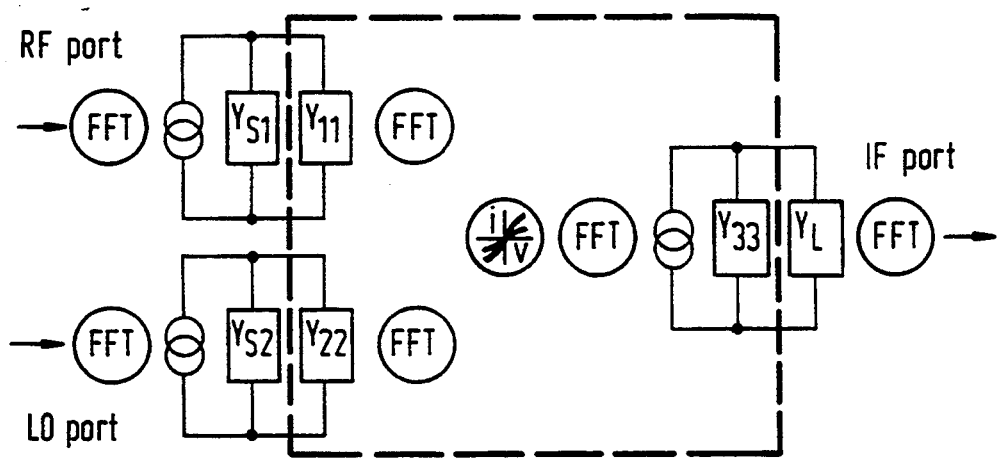
Figure 5:
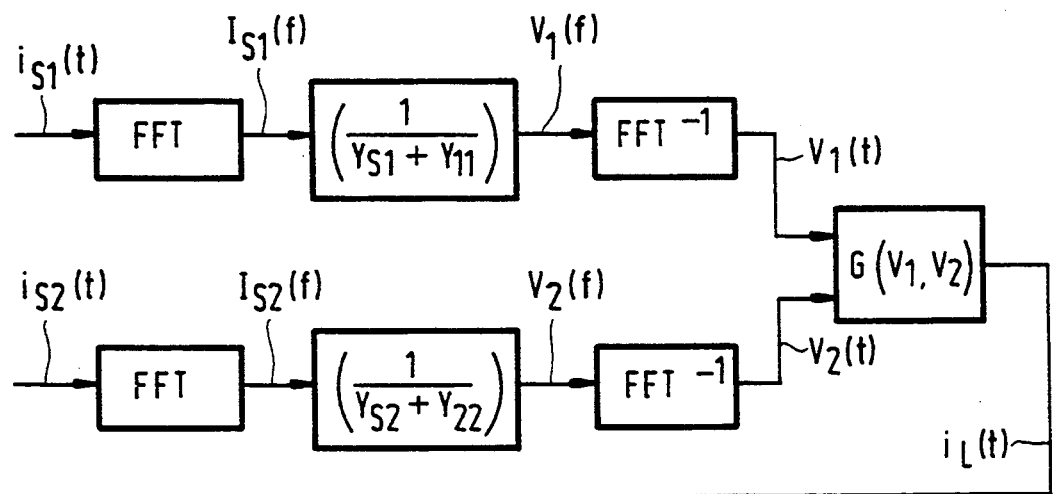
Figure 5:
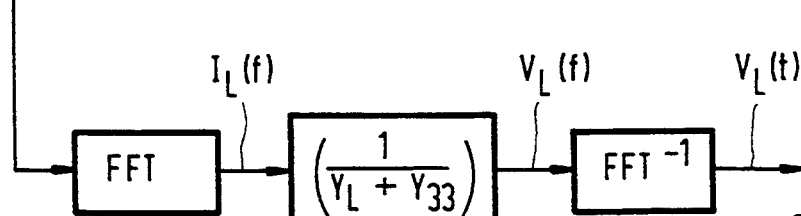
Figure 6:
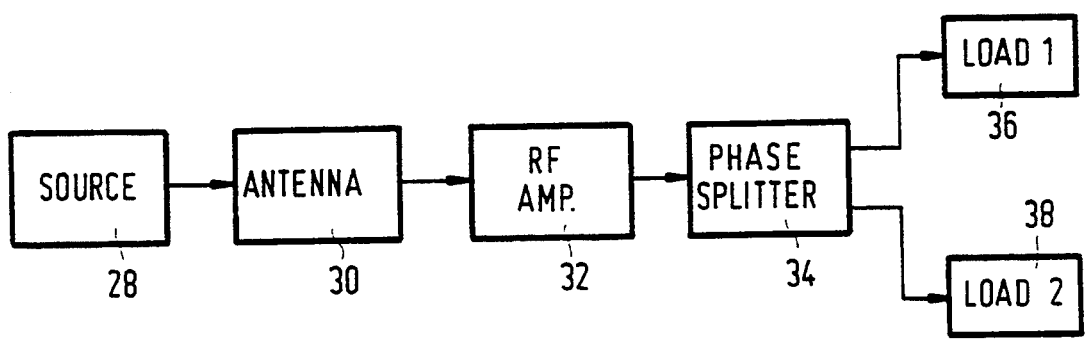
Figure 7:
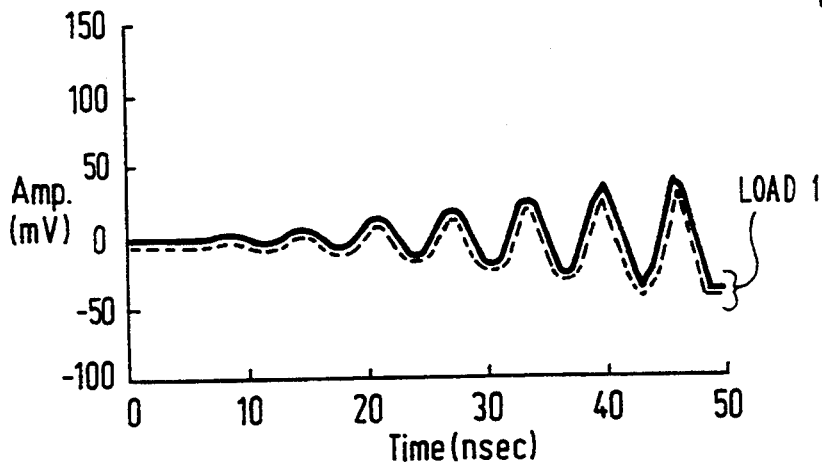
Figure 8:
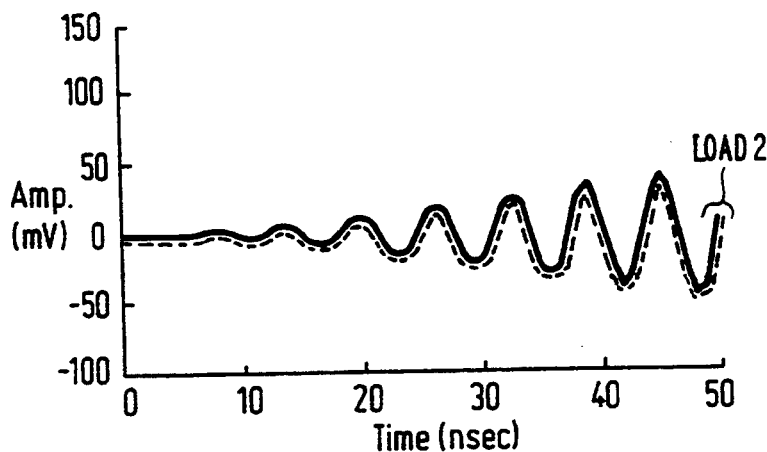
Figure 9:
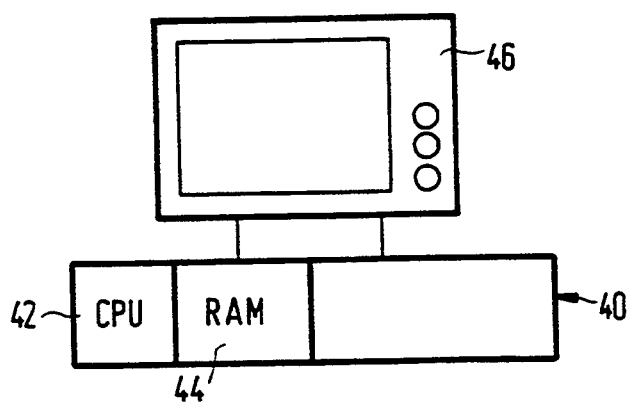

The present invention will now be described, by way of example, with reference to the accompanying drawings, wherein:

FIG. 1 diagrammatically illustrates a two-port functional block,

FIG. 2 is a flow chart illustrating the processing steps involved in a two port non-linear macro model, FIG. 3 is a schematic diagram of the same processing steps of a two-port non-linear macro model, FIG. 4 is a schematic diagram of the processing steps of a three-port non-linear macro model, FIG. 5 illustrates in greater detail the processing steps of a three-port non-linear macro model, FIG. 6 is a block schematic diagram illustrating a system level analog model of the first few functional blocks of a zero IF receiver, FIGS. 7 and 8 are graphs of time in nanoseconds (nsec) versus amplitude in millivolts (mV) of the voltages on the respective loads in FIG. 5, and FIG. 9 illustrates typical computer hardware for implementing the invention.

FIG. 1 illustrates a two port functional block 10 of say an amplifier, although the modelling method is more generally applicable. At system level the electrical quantities of interest are voltages and currents at the input and output ports, 1 and 2, respectively, rather than internal voltages, currents or field variables. The model is therefore a set of relationships between these quantities. For convenience of identification, time and frequency domain quantities will be represented by lower and upper case letters, respectively, and in FIGS. 2 and 5 the suffix (t) or (f) has been used wherever appropriate to indicate time or frequency. In FIG. 1 it is assumed that the port 1 of the functional block 10 is driven by a current source $i_s$ with an internal admittance $Y_S$ and the port 2 is loaded by an admittance $Y_L$. The current source $i_s$ is some arbitrary function of time and the high level model is required to predict a voltage $v_L$ across the load. The Fourier transforms of $i_s$ and $v_L$ are $I_S$ and $V_L$. It can be shown that if the input signal is sufficiently small, then the functional block 10 can be assumed linear, having an admittance matrix Y, and that, $$V_L = \left[ \frac{Y_{21}}{Y_{12}Y_{21} - (Y_S + Y_{11})(Y_L + Y_{22})} \right] I_S \quad (1)$$

where all terms are functions of frequency and $Y_{12}$ is the reverse trans-admittance defined by the short circuit current generated at the input port due to unit voltage at the output port, $Y_{21}$ is the forward trans-admittance defined by the short circuit current generated at the output port due to unit voltage at the input port, $Y_{11}$ is the input admittance defined by the admittance at the input port due to unit voltage at the input port, $Y_{22}$ is the output admittance defined by the admittance at the output port due to unit voltage at the output port, $Y_S$ is the source admittance which is the output admittance of the preceding block, and $Y_L$ is the load admittance which is the input admittance of the following block.

In many circuits of practical interest the first term in the denominator of equation (1), that is $Y_{12}Y_{21}$, can be ignored, either because the reverse trans-admittance $Y_{12}$ is small or because one of the factors in the second term is large. This approximation is particularly useful here since it allows the remaining function to be factorized. By splitting the numerator into two factors equation (1) becomes $$V_L = \quad (2)$$

$$(\text{minus}) \left( \frac{1}{Y_L + Y_{22}} \right)\left( \frac{Y_{21}}{Y_{21}(0)} \right)(Y_{21}(0)) \left( \frac{1}{Y_S + Y_{11}} \right) I_S$$

where $Y_{21}(0)$, introduced into both numerator and denominator for reasons that will become apparent later, is the dc forward trans-admittance.

Equation (2) represents a sequence of four product operations on the frequency domain input current, where the first operation corresponds to the factor on the right and the last to that on the left. It is convenient here to regard each operation as acting on a sequence of points in the frequency domain rather than a single point, remembering that in general the value of the operator is different for each point.

The proposed model employs a non-linear extrapolation of the linear model embodied in equation 2. The numerical efficiency of this model follows from the separation of the storage and non-linear aspects of the transmission behavior into the middle two operations. In particular the model makes use of a particular modification to the operation which in equation (2) is a simple multiplication by the linear factor $Y_{21}(0)$. Since the factor is real (not complex) the solution is unaffected if the sequence of frequency domain data is inverse Fourier transformed into the time domain before the operation (i.e. before multiplication by $Y_{21}(0)$) and then direct Fourier transformed back into the frequency domain after the operation. It should be recognized that this factor is just the first non-zero term in a Taylor expansion of the non-linear net I-V characteristic of the combination of active devices in the circuit. However, since with the additional transformations mentioned above the operation is now performed on a time domain sequence, the most significant non-linear behavior can be accounted for by using the actual characteristic rather than just the first term (which was a restriction imposed for a frequency domain operation).

FIG. 2 is a flow chart illustrating a full set of processing steps involved in a two port non-linear macro model when processing an input current waveform. Each of the processing steps is indicated in FIG. 2 by a rectangle numbered 12 to 26 and comprises:

1. Direct Fourier transform the time domain input current $i_s(t)$ to the frequency domain sequence $I_s(f)$, (Rectangle 12).

2. Multiply by $1/(Y_S(f)+Y_{11}(f))$ to obtain the frequency domain input voltage $V_1(f)$, (Rectangle 14).

3. Inverse Fourier transform the frequency domain input voltage $V_1(f)$ to the time domain sequence $v_1(t)$, (Rectangle 16).

4. Compute the time domain short circuit output current $i_2(t)$ from $v_1(t)$ using the non-linear I-V function, (Rectangle 18).

5. Direct Fourier transform the time domain output current $i_2(t)$ to the frequency domain sequence $I_2(f)$, (Rectangle 20).

6. Multiply by $Y_{21}(f)/Y_{21}(0)$ to correct $I_2(f)$ for storage effects such as delay in the trans-admittance, (Rectangle 22).

7. Multiply by $1/(Y_L(f)+Y_{22}(f))$ to obtain the frequency domain output voltage $V_L(f)$, (Rectangle 24).

8. Inverse Fourier transform the frequency domain output voltage $V_L(f)$ to the time domain sequence $V_L(t)$, (Rectangle 26).

These operations can be correlated with the schematic of the two-port non-linear model shown in FIG. 3 which is representative of a stage such as an amplifier.

When implementing this set of operations it will be noted that the full model has two direct and two inverse transforms. FFT routines from a standard mathematical library can be used. All the admittance functions and the non-linear I-V transfer function are found by running a circuit analysis package in AC and DC modes, respectively. The model can even include effects due to geometrical layout. In this case the required functions would be computed by running electromagnetic or other field simulations either as alternatives or additions to the circuit analyses.

In all cases tabular data of say the Y parameters versus frequency and current versus voltage are generated over specified intervals say from 0 to 1 GHz in steps of 5 MHz for the Y parameters. Intermediate data required by the model is generated by interpolation of the table at simulation run time. The generation of the tabular data, referred to as "model extraction", is performed only once for a given functional block. The high level macro model may then be used for any electrical signal for which voltage and frequency components remain within the intervals originally specified.

The parameters used to represent the linear and non-linear macro models are in the form of functions which are extracted from the detailed circuit and/or layout information describing the actual physical implementation of a particular functional block.

Two types of parameter function are used in the macro models, firstly, all or a subset of the admittance matrix as a function of frequency, and, secondly, a non-linear transfer function expressed as a uni-variate or in the case of the three port non-linear macro model discussed later bi-variate short circuit output current/input voltage relationship. Both types of function are stored in tables following their extraction.

The process of extraction of the admittance matrix parameters of a given block includes determining the admittance matrix values required over a specified set of frequencies $f_r$, with defined spacing $\Delta f$, such that $$f_r = r\Delta f \text{ (where } r=0,1 \ldots R) \qquad (3)$$

The $N \times N$ admittance matrix of any N-port linear circuit may be derived using the equation which shows that at frequency $f_r$ the complex node voltages $V_n^{(r)}$ and currents $I_m^{(r)}$ at the ports are related by $$I_m^{(r)} = \sum_{n=1}^{N} Y_{mn}(f_r) V_n^{(r)} \qquad (4)$$

where $m,n = 1,2 \ldots N$
and where $Y_{mn}(f_r)$ is the value of the mth row and nth column of the admittance matrix at $f_r$.

For the two and three port models described here, $N=2$ and 3, respectively.

Referring to equation (4) if a unit amplitude alternating voltage source with frequency $f_r$ is connected to port n and all the other ports are short circuited, that is, have zero volts across them, then the set of complex currents computed at all ports is equal to the nth column of the admittance matrix at that frequency.

Therefore the procedure for extracting the admittance matrix involves entering a composite circuit into a suitable circuit analysis package. This comprises two parts, the circuit describing the functional block, referred to as the 'circuit under test' and one of a set of N additional circuits referred to as the 'test jig circuits'. The package is then run for N frequency domain analyses in turn, each over the set of $(R+1)$ frequencies, outputting the $(R+1) \times N^2$ complex values of port currents. This output is then read and organized into the format required by the macro model.

The test jig circuit for extracting the nth column of the admittance at the rth frequency comprises firstly very small value resistors across ports $1 \ldots n-1, n+1 \ldots N$, to represent the short circuits and secondly a voltage source of unit amplitude and frequency $f_r$ in series with the small value resistor at port n. Some circuit simulators provide a specific short circuit component in which case this can be used instead of the small value resistors.

The required currents are then the currents in the test jig circuit resistors or short circuit components. The resistor values should be much smaller than the impedance of the circuit under test.

With reference to the extraction of non-linear transfer parameters, the non-linear transfer function of the two-port non-linear macro model is required over some specified set of input voltages $v_s$, with defined spacing $\Delta v$, such that, $$v_s = v_0 + s\Delta v \; (s=0,1 \ldots S) \qquad (5)$$

Extraction of this transfer function requires dc analysis. Since the function is a non-linear extrapolation of the dc value of the transfer admittance $Y_{21}$, it is clear that the output current must again be found under short circuit conditions.

A test jig circuit for extracting the two-port transfer function comprises firstly a very small value resistor across the output port to represent the short circuit and secondly a dc voltage source of amplitude $v_s$ across the input port.

The required current is that through the output resistor. The sign conventions are the same as for admittance extraction. A dc analysis is performed for all s (=0,1 .. . S) to generate the complete parameter table.

The extraction processes described, including the generation of test jig circuits, may be automated. In the particular implementation developed the user only has to supply the frequency step $\Delta f$ and maximum frequency $R\Delta f$, and for the two-port non-linear macro model, the voltage step $\Delta v$ and the minimum and maximum voltage(s) $v_0$ and $v_0 + S\Delta v$, respectively.

The non-linear macro model may be extended to a greater number of ports. For example a mixer model can be written using a bi-variate DC transfer function in which the short circuit output current is tabulated against the voltages at both the inputs.

FIG. 4 is a high level, three port non-linear model of a mixer block. The block has RF and local oscillator (LO) input ports and an IF output port. The order of the processing steps involved is shown in FIG. 5 and these steps make use of many of the approximations employed with the two port model. More particularly the RF and local oscillator (LO) time domain input currents $i_{S1}(t)$ and $i_{S2}(t)$ are Fast Fourier Transformed (FFT) into frequency domain currents $I_{S1}(f)$, $I_{S2}(f)$, respectively. These currents are used to compute corresponding frequency domain voltages $V_1$ and $V_2$ from input Norton equivalent circuits which give:

$$V_1(f) = \left(\frac{1}{Y_{S1} + Y_{11}}\right) I_{S1}(f)$$

and $$V_2(f) = \left(\frac{1}{Y_{S2} + Y_{22}}\right) I_{S2}(f)$$

where $Y_{S1}$ and $Y_{S2}$ are the respective source admittances which are the output admittances of the preceding blocks, and $Y_{11}$ and $Y_{22}$ are the input admittances at the respective input ports. These voltages $V_1(f)$ and $V_2(f)$ are inverse Fourier transformed to the corresponding time domain voltages $v_1(t)$ and $v_2(t)$. These voltages are operated upon by a non-linear bi-variate current/voltage dc transfer function $G(v_1, v_2)$ to determine an equivalent output current source, $i_L(t)$. This time domain current source is Fourier transformed to the frequency domain form $I_L(f)$. The output voltage $V_L(f)$ is computed from the output Norton equivalent circuit which gives:

$$V_L(f) = \left(\frac{1}{Y_L + Y_{33}}\right) I_L(f)$$

where $Y_L$ is the load admittance and $Y_{33}$ is the admittance at the output port. This frequency domain output voltage $V_L(f)$ is inverse Fourier transformed to the time domain output voltage $v_L(t)$.

It will be noted from FIGS. 4 and 5 that the non-linear bi-variate current/voltage dc transfer operation, $G(v_1, v_2)$ can only be performed when both input branches have been evaluated up to the second FFT. The order of evaluation of these two branches is unimportant. The admittances $Y_{11}$, $Y_{22}$ and $Y_{33}$ are the diagonal terms of a 3×3 admittance matrix. In the model described the reactive part of the transfer between input and output ports is assumed to have negligible effect. Also the reverse transfer from the IF port to both the RF and LO ports, and transfer between RF and LO ports, are assumed to be negligible. Following the derivation of the two-port model, the forward transfer is based on the dc relationship between the short-circuit output current and the two input voltages. As with the single input model the frequency domain voltages at the two inputs are each found by solving a Norton input equivalent circuit and the time domain input voltages are then found by inverse Fourier transforms.

By using the method in accordance with the present invention the system level analog model exhibits near perfect agreement with transient circuit analysis. FIG. 6 illustrates a set of functional blocks which was simulated using the method in accordance with the present invention and using transient circuit analysis.

The set of blocks represent the first few functional blocks of a zero IF receiver up to the splitting of the input signal which would normally be supplied to quadrature related mixers for frequency down conversion. The set comprises a signal source block 28, an antenna block 30, an RF amplifier 32, a phase splitter 34 which has outputs connected to loads 1 and 2, referenced 36,38. The RF amplifier block 32 comprises linear and non-linear tabular data prepared as mentioned above. The other blocks 28, 30, 34, 36 and 38 contain only linear components and equivalent models therefore comprise only linear data in the form of tabulated admittance matrices.

FIGS. 7 and 8 show in broken lines the output at the loads 1 and 2, that is 36 and 38 respectively, as determined using transient circuit analysis and in full lines the first few cycles of the same outputs with respect to a circuit modelled in accordance with the present invention. It will be noted that there is such a close agreement that one graph overlies the other one.

In making these simulations the signal input is at a level to drive the amplifier 32 well into non-linearity. Both the non-linearity and the complex electrical loading of each block on its neighbors was correctly taken into account.

The accuracy of both the FFT and the interpolation of the tables to derive intermediate data can be adjusted with a trade-off against speed, through for example the use of more points in the FFT and/or a higher order interpolation scheme. With respect to speed, the only significant calculations involved using a model operating in accordance with the present invention are table interpolation and Fourier transformation, both of which are extremely fast. For the example illustrated in FIG. 6 which has a total of about 30 components including 4 non-linear devices, the model is two orders of magnitude faster than transient circuit analysis which requires partial differential equations to be solved at every required time point. The speed-up factor increases substantially linearly with circuit size.

The simplicity of the calculations in the model means that coding a model in a high level language supported by a digital simulator is straightforward. One method of passing the analog signals between models in a digital simulator is to pass pointers to the data which represents these signals.

In implementing the present invention the described models together with equivalent linear models and analog-to-digital and digital-to-analog interface models have been coded in a digital simulator. The process of extraction of the tables from a selected circuit analysis package was automated inside the design environment which included the digital simulator. The extension to the digital simulator offers mixed-mode simulation where the analog blocks are designed at circuit level so that the type of technology dependent effects which ultimately limit system performance are included in the extracted parameters and therefore also in the system simulation.

In a non-illustrated embodiment of the present invention the extracted parameters are stored in the form of impedances as a function of frequency and a non-linear transfer function comprising a relationship between output voltage or voltages versus input current or currents.

FIG. 9 shows diagrammatically typical computer hardware for implementing the invention. The hardware consists of a workstation comprising a computer console 40 having the necessary central processing unit (CPU) 42 and random access memory (RAM) 44 to perform the calculations, store the intermediate results and ultimately provide an output which is displayed on a monitor 46 and/or printed out on a plotter (not shown).

The program and data can be supplied to the computer console 40 by any suitable means, known per se.

From reading the present disclosure, other modifications will be apparent to persons skilled in the art. Such modifications may involve other features which are already known in the simulation of electronic circuits and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of simulating an electronic system comprising interconnected functional blocks, said method comprising the steps of:
    a)—inputting data into a digital computer which data concerns a low level description of each of said functional blocks;
    b)—extracting parameters from said low level description by using a central processing unit accessible to said digital computer which parameters define at least in part a dependence of said low level description on signal frequency and signal level;
    c)—storing said extracted parameters in a memory device accessible to said digital computer;
    d)—creating, by using said central processing unit, a high level macro model of each of said functional blocks from said extracted parameters;
    e)—interconnecting said high level macro models using said central processing unit;
    f)—applying an input signal to said interconnected high level macro models;
    g)—computing, by using said central processing unit, output signals of said interconnected high level macro models in response to the input signal, including computing the effect of the interaction of each high level macro model with its neighboring high level macro model;
    h)—monitoring the output signals of said interconnected high level macro models;
    i)—comparing the monitored output signals with predetermined values indicative of an expected performance of the electronic system; and
    j)—performing the following steps if the monitored output signals do not closely match said predetermined values
        i) extracting, by using said central processing unit, said stored parameters from said memory device;
        ii) modifying said low level description such that a closer match between said predetermined values and the monitored output signals is achieved;
        iii) extracting, by using said central processing unit, modified parameters from said low level description and replacing said stored parameters with said modified parameters;
        iv) creating high level macro models from said modified stored parameters by using said central processing unit; and
        v) repeating steps e through j until the monitored output signals closely match said predetermined values.

2. A method as claimed in claim 1, wherein said extracted parameters are stored nationally in tabular form.

3. A method as claimed in claim 2, wherein said extracted parameters are admittances as a function of frequency and a non-linear transfer function having a relationship between output current or currents versus input voltage or voltages.

4. A method as claimed in claim 3, wherein one of said functional blocks is a two-port functional block and said step of creating a high level macro model includes a step of modelling said two-port functional block as a block having an input port driven by a current source $i_S$ having an internal frequency domain admittance $Y_S$ and an output port loaded by a frequency domain admittance $Y_L$, wherein in the small signal limit said two-port functional block is linear and the voltage across said load at said output port is as follows:

$$V_L = \left[ \frac{Y_{21}}{Y_{12}Y_{21} - (Y_S + Y_{11})(Y_L + Y_{22})} \right] I_S$$

where all terms are functions of frequency and $Y_{12}$ symbolizes a reverse trans-admittance defined by a short circuit current generated at said input port due to unit voltage at said output port, $Y_{21}$ symbolizes a forward trans-admittance defined by a short circuit current generated at said output port due to unit voltage at said input port, $Y_{11}$ symbolizes an input admittance defined by an admittance at said input port due to unit voltage at said input port, $Y_{22}$ symbolizes an output admittance defined by an admittance at said output port due to unit voltage at said output port, $Y_S$ symbolizes an input admittance which is an output admittance of a preceding block, and $Y_L$ is the load admittance which is an input admittance of a following block, characterized in that for large signals both linear and non-linear behaviors are modelled by a series of approximations in which $Y_{12} Y_{21}$ is ignored, in which the term in brackets in the above equation is factorized into four frequency domain operators such that $$\left[ V_L = \left( \frac{1}{Y_L + Y_{22}} \right) \left( \frac{Y_{21}}{Y_{21}(0)} \right) (Y_{21}^{(0)}) \left( \frac{1}{Y_S + Y_{11}} \right) I_S \right]$$

$$V_L = - \left( \frac{1}{Y_L + Y_{22}} \right) \left( \frac{Y_{21}}{Y_{21}(0)} \right) (Y_{21}^{(0)}) \left( \frac{1}{Y_S + Y_{11}} \right) I_S$$

where $\overline{Y_{21}(0)}$ symbolizes a dc forward trans-admittance, and in which inverse and direct Fourier transformation respectively precede and follow the operation $(Y_{21}(0))$ which is carried out in the time domain the real operator $(Y_{21}(0))$ having been replaced by a real non-linear transfer function to which $(Y_{21}(0))$ is a linear approximation.

5. A method as claimed in claim 3, wherein one of said functional blocks is a three-port functional block having first and second input ports and an output port, and wherein said step of creating a high level macro model includes the step of modelling both large signal linear and non-linear behaviors by a series of approximations in which first and second frequency domain input voltages $V_1(f)$ and $V_2(f)$ are derived from input Norton equivalent circuits which give:

$$V_1(f) = \left( \frac{1}{Y_{S1} + Y_{11}} \right) I_{S1}(f)$$

and $$V_2(f) = \left( \frac{1}{Y_{S2} + Y_{22}} \right) I_{S2}(f),$$

where $I_{S1}(f)$ and $I_{S2}(f)$ are frequency domain source currents, $Y_{S1}$ and $Y_{S2}$ are first and second source admittances respectively and $Y_{11}$ and $Y_{22}$ are input admittances at said first and second input ports, said input voltages $V_1(f)$ and $V_2(f)$ are transformed to time domain voltages $v_1(t)$ and $v_2(t)$, a non-linear bi-variate current-/voltage dc transfer operation is carried out to determine an equivalent output current source $i_L(t)$, said current source $i_L(t)$ is transformed into its frequency domain equivalent from $I_L(f)$, a frequency domain output voltage $V_L(f)$ is computed from the output Norton equivalent circuit which gives:

$$V_L(f) = \left( \frac{1}{Y_L + Y_{33}} \right) I_L(f)$$

where $Y_L$ symbolizes load admittance and $Y_{33}$ symbolizes output admittance, and in which said output voltage $V_L(f)$ is transformed to a corresponding time domain sequence $v_L(t)$.

6. A method as claimed in claim 5, characterized in that the non-linear behavior is simulated in the time domain by using an actual characteristic, of said non-linear behavior.

7. A method as claimed in claim 5, characterised in that a non-linear I-V transfer function is found by running a circuit analysis package in a DC mode.

8. A method as claimed in claim 2, wherein said extracted parameters are stored in form of impedances as a function of frequency and a non-linear transfer function having a relationship between output voltage or voltages versus input current or currents.

9. A method of simulating propagation of a signal through an electronic system, the method comprising the steps of:

—inputting data into a digital computer which data represents a low system level description of functionally collaborating blocks;

—representing said electronic system as a collection of functionally collaborating blocks by using a central processing unit accessible to said digital computer;

—for each particular one of said functionally collaborating blocks calculating physical quantities at a high system level using said central processing unit, the calculation being based on the low system level description of the particular one of said functionally collaborating blocks;

—storing said physical quantities in a memory accessible by said digital computer;

—applying a signal to said functionally collaborating blocks;

—calculating, using said central processing unit, the propagation of the signal among said functionally collaborating blocks on the basis of said physical quantities at said high system level, including calculating effects due to an interaction of each block on neighboring blocks;

—monitoring a result of the calculation of the propagation to check a behavior of said electronic system;

—comparing said result to predetermined values indicative of an expected performance of the electronic system; and —modifying said low system level description to obtain a close match between said predetermined values and said result if a close match was not previously obtained.

10. A method as claimed in claim 9, characterised in that said physical quantities at said high system level for said particular block include at least an admittance.

11. A method as claimed in claim 9, characterized in that said physical quantities at said high system level for said particular block include a non-linear function having a relationship between an output current of said particular block and an input voltage of said particular block.

12. A method as claimed in claim 9, characterized in that said physical quantities at said high system level include at least an output voltage of a block and an input current of a block and in that said calculation of the propagation of the signal utilizes a linear relationship between said input current of said block and said output voltage of said block in a frequency domain representation, the relationship involving a Fourier-transform of a non-linear transfer function at said high system level.

13. The method according to claim 9, wherein said physical quantities define at least in part a dependence of said low system level description on signal frequency and signal level.

14. An apparatus for simulating an electronic system having interconnected functional blocks, comprising:
- a digital computer for receiving data concerning a low level description of each of said functional blocks;
- a central processing unit, accessible to said digital computer, for extracting parameters from said low level description, said central processing unit including means for creating a high level macro model of each of said functional blocks from said extracted parameters and for interconnecting said high level macro models;
- a memory device accessible to said digital computer, for storing said extracted parameters;
- means for applying an input signal to said interconnected high level macro models, wherein said central processing unit computes output signals of said interconnected high level macro models in response to the input signal, including computing the effect of the interaction of each high level macro model with its neighboring macro model;
- means for monitoring the output signals of said interconnected high level macro models;
- comparison means for comparing the monitored output signals with predetermined values indicative of an expected performance of the electronic system; and
- means for modifying said low level descriptions, and wherein said central processing unit extracts and stores in said memory device modified parameters from said modified low level description if the monitored output signals do not closely match said predetermined values.

15. The apparatus according to claim 14, wherein said extracted parameters define at least in part a dependence of said low level description on signal frequency and signal level.

* * * * *